US012469751B2

(12) United States Patent
Moalem

(10) Patent No.: US 12,469,751 B2
(45) Date of Patent: Nov. 11, 2025

(54) APPARATUS TO DETECT AND QUANTIFY RADICAL CONCENTRATION IN SEMICONDUCTOR PROCESSING SYSTEMS

(71) Applicant: Applied Materials, Inc., Santa Clara, CA (US)

(72) Inventor: Mehran Moalem, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 496 days.

(21) Appl. No.: 17/735,837

(22) Filed: May 3, 2022

(65) Prior Publication Data

US 2022/0392812 A1 Dec. 8, 2022

Related U.S. Application Data

(60) Provisional application No. 63/242,402, filed on Sep. 9, 2021, provisional application No. 63/196,576, filed on Jun. 3, 2021.

(51) Int. Cl.
*H01L 21/66* (2006.01)
*H01J 37/32* (2006.01)

(52) U.S. Cl.
CPC ........ *H01L 22/20* (2013.01); *H01J 37/32816* (2013.01); *H01J 37/32899* (2013.01); *H01J 37/32981* (2013.01); *H01J 2237/244* (2013.01); *H01J 2237/24585* (2013.01)

(58) Field of Classification Search
CPC .................................................... H01L 22/20
See application file for complete search history.

(56) References Cited

U.S. PATENT DOCUMENTS

| 4,448,529 A | * | 5/1984 | Krause .................. G01J 3/2846 250/281 |
| 9,355,922 B2 | | 5/2016 | Park et al. |

(Continued)

FOREIGN PATENT DOCUMENTS

| JP | H8288274 A | 11/1996 |
| JP | H09145675 | 6/1997 |

(Continued)

OTHER PUBLICATIONS

International Search Report and Written Opinion from Patent Application No. PCT/US2022/029302 dated Sep. 15, 2022, 10 pgs.

(Continued)

*Primary Examiner* — William A Harriston
(74) *Attorney, Agent, or Firm* — Schwabe, Williamson & Wyatt, P.C.

(57) ABSTRACT

Embodiments disclosed herein include a processing tool for measuring neutral radical concentrations. In an embodiment, the processing tool comprises a processing chamber, and a neutral radical mass spectrometry (NRMS) analyzer fluidically coupled to the processing chamber. In an embodiment, the NRMS analyzer comprises a first chamber fluidically coupled to the processing chamber, where the first chamber comprises a modulator, and a second chamber fluidically coupled to the first chamber, where the second chamber is a residual gas analyzer or a mass spectrometer. In an embodiment, an unobstructed line of sight passes from the processing chamber to the second chamber.

19 Claims, 6 Drawing Sheets

(56) References Cited

U.S. PATENT DOCUMENTS

| | | | |
|---|---|---|---|
| 2004/0089803 A1* | 5/2004 | Foley | .................... H01J 49/049 |
| | | | 250/288 |
| 2006/0075968 A1 | 4/2006 | Leung et al. | |
| 2020/0016635 A1* | 1/2020 | Hsiao | ................ H01L 21/31138 |
| 2022/0102123 A1* | 3/2022 | Zhao | ........................ H01J 49/06 |

FOREIGN PATENT DOCUMENTS

| | | | |
|---|---|---|---|
| JP | 2009152269 A | | 7/2009 |
| JP | 2016080679 A | | 5/2016 |
| JP | 2020020586 A | | 2/2020 |
| JP | 2020065013 A | | 4/2020 |
| JP | 2020196452 A | | 4/2021 |
| TW | 200735173 A | | 9/2007 |
| TW | 202007945 A | | 2/2020 |
| WO | 2020196452 A1 | | 10/2020 |
| WO | 2021069882 A1 | | 4/2021 |

OTHER PUBLICATIONS

International Preliminary Report on Patentability from PCT/US2022/029302 dated Dec. 14, 2023, 7 pgs.

Official Letter from Taiwan Patent Application No. 111119442 dated Sep. 2, 2024, 12 pgs.

Nojiro Yasuhiro, Iino Daiki, Suzuki Keiji, Toyoda Hirotaka, Application of Plasma Diagnostic Technologies to HBr Plasma for Si Dry Etching of Semiconductor Devices, Toshiba Review, Feb. 1, 2014, vol. 69, No. 2, pp. 41 and 42.

Dietmar Kobertz, Investigations at High Temperature With Molecular Beam Mass Spectrometry Under Equilibrium and Kinetic Conditions, ECS Transactions, Jun. 2013, 46(1), pp. 113-126.

J.P. Dworzanski, H.L.C. Meuzelaar, Pyrolysis Mass Spectrometry, Methods, Encyclopedia of Spectroscopy and Spectrometry, Oct. 10, 2016, pp. 789-801.

Frank Drewnick et al., A New Time-of-Flight Aerosol Mass Spectrometer (TOF-AMS)—Instrument Description and Firs Field Deployment, Aerosol Scienceand Technology, Feb. 23, 2007, 39(7), pp. 637-658.

Notice of Reasons for Rejection for Japanese Patent Application No. 2023-574345, dated Nov. 12, 2024, 8 pages.

Notice of Reasons for Rejection for Japanese Patent Application No. 2023-574345, dated Mar. 11, 2025, 13 pgs.

Office Action for Taiwan Patent Application No. 111119442, dated Jan. 23, 2025, 5 pages.

Notice to File a Response for Korean Patent Application No. 10-2023-7045273 dated Feb. 27, 2025, 6 pgs.

Extended European Search Report from European Patent Application No. 22816633.6, Communication dated Mar. 10, 2025, completion of the search dated Feb. 14, 2025, 10 pgs.

Park, Soonam, et al., "Molecular Beam Mass Spectrometry System for Characterization of Thermal Plasma Chemical Vapor Deposition," Plasma Chemistry and Plasma Processing, vol. 24, No. 3, Sep. 2004, 20 pgs.

Singh, Harmeet, et al., "Mass spectrometric detection of reactive neutral species: Beam-to-background ratio," Department of Chemical Engineering, University of California, Berkeley, California 94720, J. Vac. Sci. Technol. A 17(5), Sep./Oct. 1999, American Vacuum Society, 9 pgs.

Decision of Rejection and Decision of Nonacceptance of Amendments from Japanese Patent Application No. 2023-574345 dated Sep. 24, 2025, 2 pgs.

\* cited by examiner

APPARATUS TO DETECT AND QUANTIFY RADICAL CONCENTRATION IN SEMICONDUCTOR PROCESSING SYSTEMS

CROSS-REFERENCE TO RELATED APPLICATIONS

This application claims the benefit of U.S. Provisional Application No. 63/196,576, filed on Jun. 3, 2021 and U.S. Provisional Application No. 63/242,402, filed on Sep. 9, 2021, the entire contents of which are hereby incorporated by reference herein.

BACKGROUND

1) Field

Embodiments of the present disclosure pertain to the field of semiconductor processing and, in particular, to a tool to implement neutral radical mass spectrometry (NRMS) and methods of using an NRMS tool.

2) Description of Related Art

In semiconductor processing, radical species are often used for various processing operations in a chamber. For example, a radical species, such as atomic fluorine, may be used in an etching or a chamber cleaning process. Radical species can be formed by various processes. One process to generate radical species is to use a plasma. For example, a fluorine containing gas is flowed into the chamber, and the plasma breaks the compound into elemental fluorine. Radical species are highly chemically reactive. The chemically active free radicals generated in the plasma can diffuse to the sample surface (e.g., a wafer surface). The free radicals decrease the activation energy in a chemical reaction, resulting in material removal. The volatile chemical reaction byproducts are removed from the sample surface and the process chamber by the vacuum system.

Process control of radical species is difficult. Particularly, it is currently not possible to effectively measure radical species concentration in a processing chamber. This is due, in part, to the highly reactive nature of the radical species. The radical species react whenever the radical species contacts any surface or other compound. Even if the surface does not react with the radical species, it still may serve as a site for recombination of the radicals with each other thus converting the species to other useless compounds. As such, existing mass spectrometry tools are not able to measure the concentration of radical species. Without the ability to quantitatively measure the radical species concentrations, effective process control, such as closed loop control, is not possible in existing semiconductor-manufacturing tools.

SUMMARY

Embodiments disclosed herein include a processing tool for measuring neutral radical concentrations. In an embodiment, the processing tool comprises a processing chamber, and a neutral radical mass spectrometry (NRMS) analyzer fluidically coupled to the processing chamber. In an embodiment, the NRMS analyzer comprises a first chamber fluidically coupled to the processing chamber, where the first chamber comprises a modulator, and a second chamber fluidically coupled to the first chamber, where the second chamber is a residual gas analyzer or a mass spectrometer. In an embodiment, an unobstructed line of sight passes from the processing chamber to the second chamber.

Embodiments disclosed herein may also comprise a method of processing a substrate. In an embodiment, the method comprises initiating a plasma in a processing chamber that comprises a substrate. In an embodiment, the method continues with measuring a concentration of radical species in the plasma with a neutral radical mass spectrometry (NRMS) analyzer that is fluidically coupled to the processing chamber. In an embodiment, the method further comprises comparing a measured concentration of the radical species in the plasma with a setpoint concentration of the radical species, and adjusting one or more plasma parameters with a controller in order to return the measured concentration of the radical species to the setpoint concentration of the radical species.

An additional embodiment, may include a plasma processing tool. In an embodiment, the processing tool comprises a processing chamber, and a neutral radical mass spectrometry (NRMS) analyzer fluidically coupled to the processing chamber. In an embodiment, the NRMS analyzer comprises a first chamber fluidically coupled to the processing chamber by an isolation gate valve, where the first chamber comprises a modulator, and where a first pump is fluidically coupled to the first chamber. In an embodiment, the NRMS analyzer further comprises a second chamber fluidically coupled to the first chamber, where the second chamber is a residual gas analyzer or a mass spectrometer, where a second pump is fluidically coupled to the second chamber, and where an unobstructed line of sight passes from the processing chamber to the second chamber.

DETAILED DESCRIPTION

Figure 1:
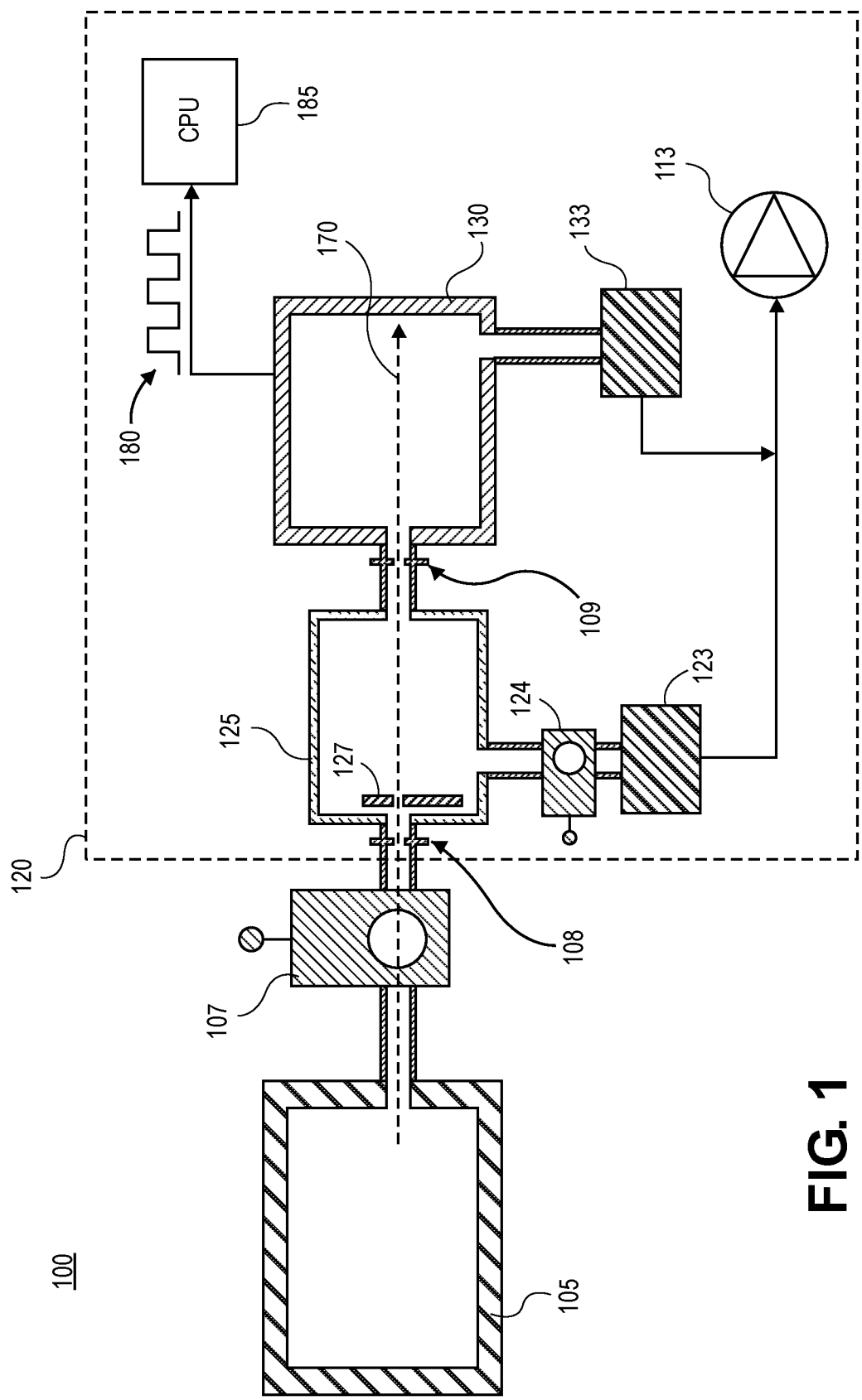
FIG. 1 is a schematic illustration of a processing chamber that is coupled to a neutral radical mass spectrometry (NRMS) analyzer, in accordance with an embodiment.

A tool to implement neutral radical mass spectrometry (NRMS) and methods of using an NRMS tool are described herein. In the following description, numerous specific details are set forth in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

As noted above, it is currently not possible to measure the concentration of radical species in a processing tool, such as a plasma chamber. Radical species are difficult to measure, in part, due to their high chemical reactivity with other elements. For example, the radical species may react with other gasses in the process, the surface of the workpiece, the surface of the chamber, and the like. Since the radical species are a primary driver of the desired chemical reactions in the process (e.g., radical fluorine is a primary driver in an etching operation) it is highly desirable to obtain quantitative measurements of the radical species concentration in real time.

Without the ability to have a quantitative measurement of the concentration of radical species, closed loop control of the processing environment is not possible. Closed loop control refers to the use of quantitative measurements as a feedback signal to a controller in order to modify processing conditions in an ongoing process. For example, in the case of the measurement of radical species, a concentration of the radical species can be measured, and the measured value can be compared to a setpoint value. When the measured value is below the setpoint value, processing parameters may be changed to increase the generation rate and output concentration of radical species, or when the measured value is above the setpoint value, processing parameters may be changed to decrease the concentration of radical species. As such, more stable and reproducible processes can be implemented.

Accordingly, embodiments disclosed herein include the use of a neutral reactive (radical) mass spectrometry (NRMS) analyzer. The NRMS analyzer is coupled to a processing chamber, such as a plasma processing chamber. The NRMS analyzer may include a pair of vacuum chambers. A first vacuum chamber includes a modulator, and a second chamber comprises the residual gas analyzer. Differential pumping allows for the first vacuum chamber to be at a pressure lower than the processing chamber, and allows for the second vacuum chamber to be at a pressure lower than the first vacuum chamber. Due to the step downs in pressure, a molecular beam including the radicals will travel from the processing chamber to the residual gas analyzer. Furthermore, a line of sight path is present from the processing chamber to the residual gas analyzer. This ensures that the molecular beam does not contact any surfaces between the plasma source and the residual gas analyzer. As such, an accurate and reproducible measurement of the radical concentration in the process chamber is provided.

In an embodiment, the NRMS analyzer further includes a modulator to mitigate the presence of noise. The modulator chops the molecular beam and when the beam is detected by RGA it generates a square wave signal that can be processed using a lock-in amplifier. Since the frequency of the square wave signal is known, noise that is at different frequencies can be filtered out, leaving behind a pristine signal with a high signal-to-noise ratio. Accordingly, accurate and sensitive readings can be used to inform a controller that is capable of closed loop control of a processing operation.

Referring now to FIG. 1, a schematic illustration of a tool 100 is shown, in accordance with an embodiment. In an embodiment, the tool 100 comprises a processing chamber 105. The processing chamber 105 may be a plasma chamber or other sub-atmospheric chamber. In an embodiment, the processing tool 105 is suitable for an etching operation, a deposition operation, a chamber cleaning operation, a plasma treatment operation, or any other type of operation typical of a semiconductor manufacturing facility. In an embodiment, one or more substrates (e.g., wafers) (not shown) may be provided within the processing tool 105. In an embodiment, processing chamber 105 may be maintained at a pressure suitable for the desired operation. In a particular embodiment, the pressure may be between approximately 1 Torr and approximately 200 Torr.

In an embodiment, the tool 100 may further comprise an NRMS analyzer 120 that is fluidically coupled to the processing chamber 105. For example, a valve 107 may be provided along a tube between the processing chamber 105 and the NRMS analyzer 120. In an embodiment, the valve 107 is a type of valve that allows for an unobstructed line of sight 170 between the processing chamber 105 and the NRMS analyzer 120. For example, the valve 107 may be an isolation gate valve. An isolation gate valve may allow for a binary state of operation. That is, the valve 107 may be open (i.e., 1) or closed (i.e., 0). When the valve 107 is open, the line of sight 170 is unobstructed and a pristine molecular beam from the processing chamber 105 may pass into the NRMS analyzer 120. The use of such a valve 107 is distinct from typical valves used processing chambers. Typically, a needle valve would be used. However, a needle valve would result in the line of sight 170 being obstructed. As such, a pristine molecular beam may not travel out from the processing chamber 105 when a needle valve is used.

In an embodiment, the NRMS analyzer 120 may comprise a first chamber 125. The first chamber is fluidically coupled to the valve 107 by a tube. In an embodiment, an orifice 108 may be provided between the valve 107 and the first chamber 125. The orifice 108 may have a diameter that is approximately 1 mm or smaller. However, it is to be appreciated that the line of sight 170 passes through the orifice 108 unobstructed. In an embodiment, the first chamber 125 may be at a pressure lower than the processing chamber 105. For example, a turbo pump 123 may provide a desired pressure to the first chamber 125. In an embodiment, the pressure in the first chamber 125 may be between approximately 1 mTorr and approximately 100 mTorr. In a particular embodiment, the pressure in the first chamber 125 may be approximately 10 mTorr. A valve 124 may be provided between the first chamber 125 and the turbo pump 123. The turbo pump 123 may be fluidically coupled to a fore pump 113.

Despite being fluidically coupled together, a pressure difference between the processing chamber 105 and the first chamber 125 may be maintained. The pressure differential may be maintained by the use of a small orifice 108 and the turbo pump 123. That is the turbo pump 123 is not the same pump that is used for the processing chamber 105. Such a setup (i.e., a setup with each chamber having its own pump) may be referred to herein as a differential pumping arrangement. One embodiment may be the use of a multi-stage pump with different stages connected to the two differentially pumped chambers thus allowing for different pressure in each chamber. Radical species flow from the processing chamber 150 to the first chamber 125 along the unobstructed line of sight 170 while the lower pressure in subsequent chambers reduces the background of target species thus effectively increasing the signal to noise ratio.

In an embodiment, the first chamber 125 may be referred to as a modulation chamber. This is because the first chamber 125 may comprise a modulator 127. The modulator 127 may be a device that allows for the molecular beam to be modulated. For example, the modulator 127 may include a rotating disk with an opening in right location that allows for the molecular beam to pass through a fraction of the time, while the remainder of the time, the modulator 127 blocks the molecular beam. As such, the molecular beam is switched on and off by the modulator 127.

Figure 2:
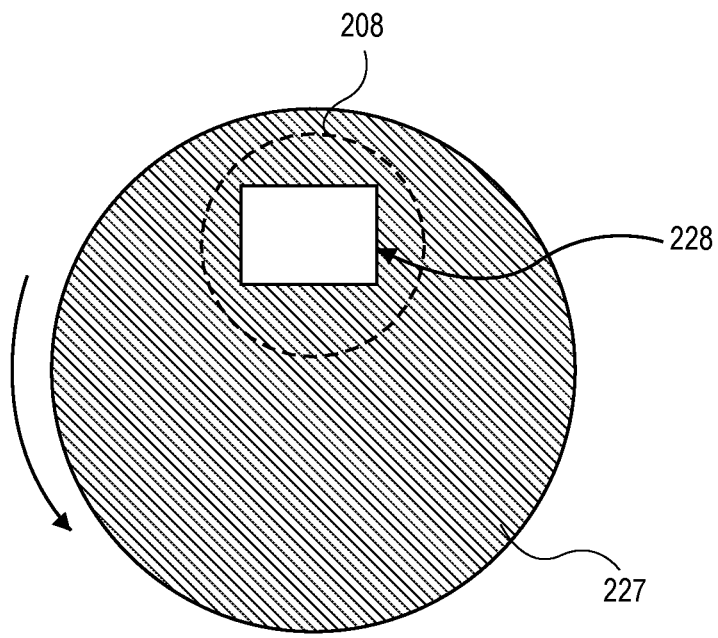
FIG. 2 is an illustration of a modulator for use in the NRMS analyzer, in accordance with an embodiment.

Referring now to FIG. 2, an illustration of a modulator is shown, in accordance with an embodiment. As shown, the modulator 227 comprises an opening 228. As the modulator 227 is spun (as indicated by the arrow) the opening 228 aligns with the orifice 208. When the opening 228 is aligned with the orifice 208, the signal is on, and when the opening is not aligned with the orifice 208, the signal is off. The speed of rotation can be selected to provide a desired frequency to the signal. For example, the frequency may be chosen to be between approximately 10 Hz and approximately 1000 Hz. In a particular embodiment, the frequency may be approximately 40 Hz. In the illustrated embodiment, a single opening 228 is shown. However, it is to be appreciated that multiple openings 228 may be used to increase the signal frequency without needing to increase the speed of rotation of the modulator 227.

Referring back to FIG. 1, a second chamber 130 is fluidically coupled to the first chamber 125. The second chamber 130 may be a residual gas analyzer (RGA), a mass spectrometer, or the like. The second chamber 130 is maintained at a pressure that is lower than the pressure of the first chamber 125. In an embodiment, the second chamber 130 may have a pressure between approximately 0.1 µTorr and approximately 100 µTorr. In a particular embodiment, the pressure in the second chamber 130 may be approximately 1 µTorr. The pressure in the second chamber 130 may be maintained by a turbo pump 133. As noted above, the use of separate turbo pumps 133 between the first chamber 125 and the second chamber 130 may be referred to as differential pumping.

In an embodiment, the second chamber 130 is fluidically coupled to the first chamber 125 through an orifice 109 along a tube between the two chambers. The orifice 109 may have a diameter that is approximately 1 mm or smaller. Despite the small diameter, the line of sight 170 continues from the first chamber 125 to the second chamber 130. That is, the line of sight 170 is unobstructed from the processing chamber 105, to the first chamber 125, and into the second chamber 130. As such, a molecular beam of radical species can pass from the processing chamber 105 to the second chamber 130 (i.e., the mass spectrometer or the RGA) without contacting any surfaces. The pristine nature of the molecular beam results in a concentration reading at the second chamber 125 that is essentially identical to the concentration of radicals within the processing chamber 105.

Figure 3A:
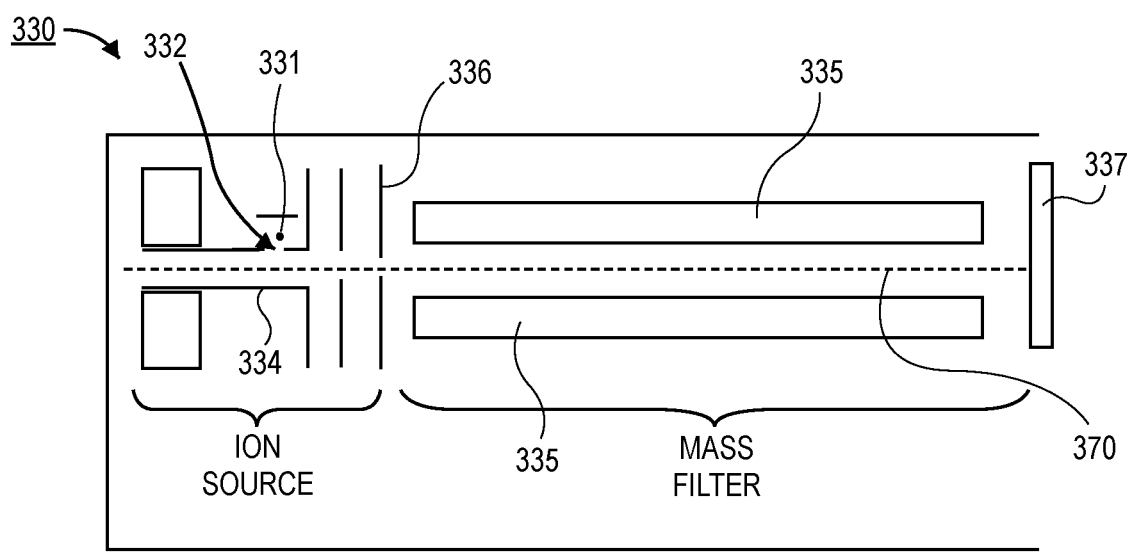
FIG. 3A is a schematic of a residual gas analyzer, in accordance with an embodiment.

Referring now to FIG. 3A, a schematic of the second chamber 330 is shown, in accordance with an embodiment. The second chamber 330 may comprise an ion source and a mass filter. The mass filter may be tuned to filter out all ionic species except the ones having a particular atomic or molecular mass to charge ratio. As shown, the line of sight 370 continues through the RGA components of the second chamber. While a specific RGA architecture is shown in FIG. 3A, it is to be appreciated that any suitable RGA or mass spectrometer arrangement may be used in conjunction with the NRMS analyzer 120.

In the particular embodiment shown in FIG. 3A, a quadrupole mass spectrometer is shown. That is, a pair of the rods 335 are shown in the illustrated cross-section. The third and fourth rods 335 are out of the plane of FIG. 3A. In an embodiment, a filament 331 is provided at a first end of the RGA device. The filament 331 may be a tungsten filament or any other suitable material for generating electrons. In an embodiment, the filament 331 is held at a potential of approximately −70V. The electrons enter the optical path 370 through an opening 332 through grounded components 334 of the ion source. The electrons hit reactive species along the line of sight 370 and ionize them. Negative potential ion optics and extraction plate 336 focus the ionized reactive species before entering the mass filter portion of the RGA device.

The mass filter may include a set of four rods 335. The rods 335 may be supplied an AC voltage. For example, the AC voltage may be approximately 2,000V. In an embodiment, a DC voltage may be supplied over the AC voltage. Control of the DC voltage allows for the selection of the mass that will propagate through the four rods 335 to a sensor 337. In a particular embodiment, the DC voltage may be between approximately 0V and approximately 100V. The sensor 337 senses the number of radical species that have made it through the RGA device. In an embodiment, the sensor 337 may comprise an electron multiplier in order to increase the sensitivity of the device. In other embodiments, the sensor 337 may comprise a Faraday cup.

Figure 3B:
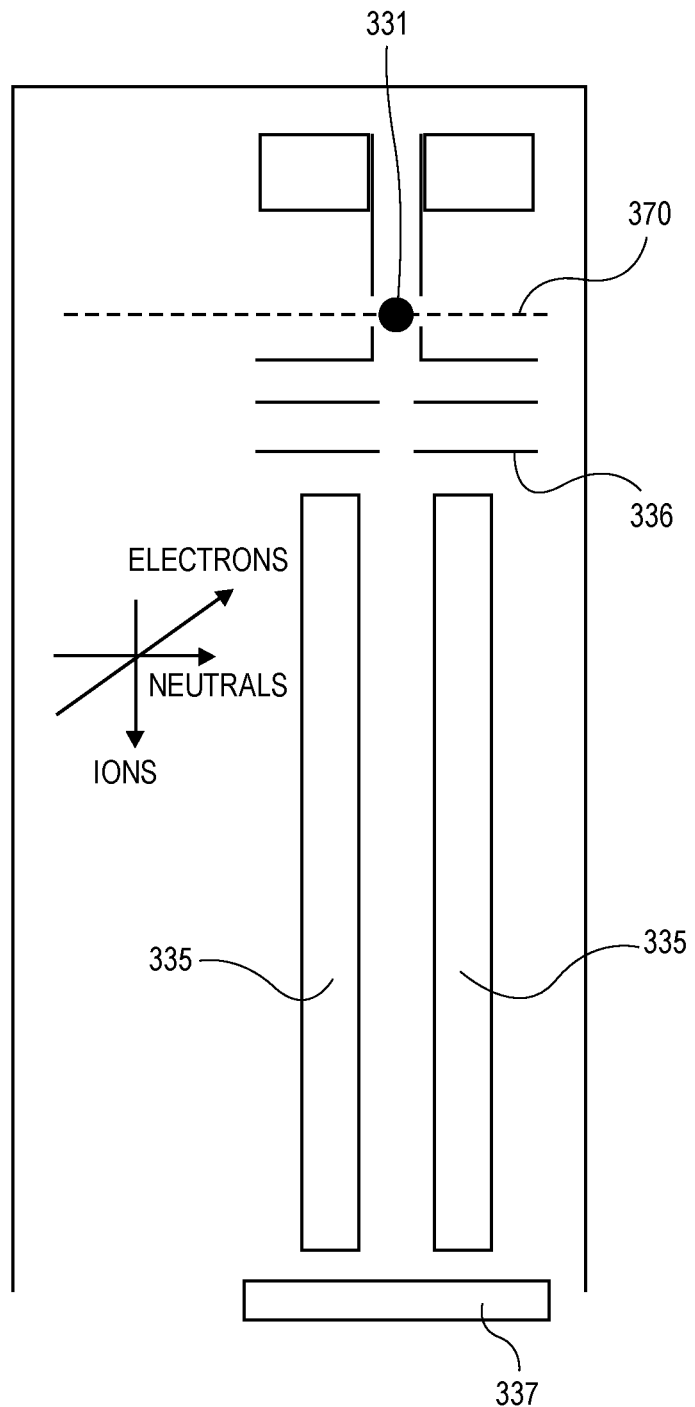
FIG. 3B is a schematic of a residual gas analyzer that uses cross-beam ionization, in accordance with an embodiment.

Referring now to FIG. 3B, a cross-sectional illustration of an RGA device in accordance with an additional embodiment. The RGA in FIG. 3B utilizes cross-beam ionization. As indicated by the axes, neutrals along the molecular beam 370 travel from left to right. The electrons from the filament 331 propagate into the plane of FIG. 3B. The ions resulting from the collision of electrons with neutral species are then propagated down towards the mass filter portion and the sensor 337. That is, the sensor 337 need not be in line with the molecular beam 370 in some embodiments.

Referring back to FIG. 1, a signal 180 is provided from the NRMS analyzer 120 to a computer 185. As shown, the signal 180 is a modulated signal (e.g., a square wave). The modulated signal 180 is provided as a result of the modulator 127. As will be described in greater detail below, the modulated signal 180 may be used in conjunction with signal processing operations in order to provide a high signal-to-noise ratio. In an embodiment, the computer 185 may be any computational device that is able to receive the modulated signal 180 as an input. In such an embodiment, the computer 185 may analyze the modulated signal 180 in order to determine a concentration of the radical species in the processing chamber 105. In a particular embodiment, the computer 185 may be a controller. When the radical concentration is away from a desired setpoint, the controller may be configured to change one or more processing parameters of processing chamber 105 (e.g., gas flow rates, voltages, frequencies, or any other controllable parameter) in order to return the radical concentration to the desired setpoint. In this way, the NRMS analyzer 120 allows for closed loop control of the processing environment.

Figure 4:
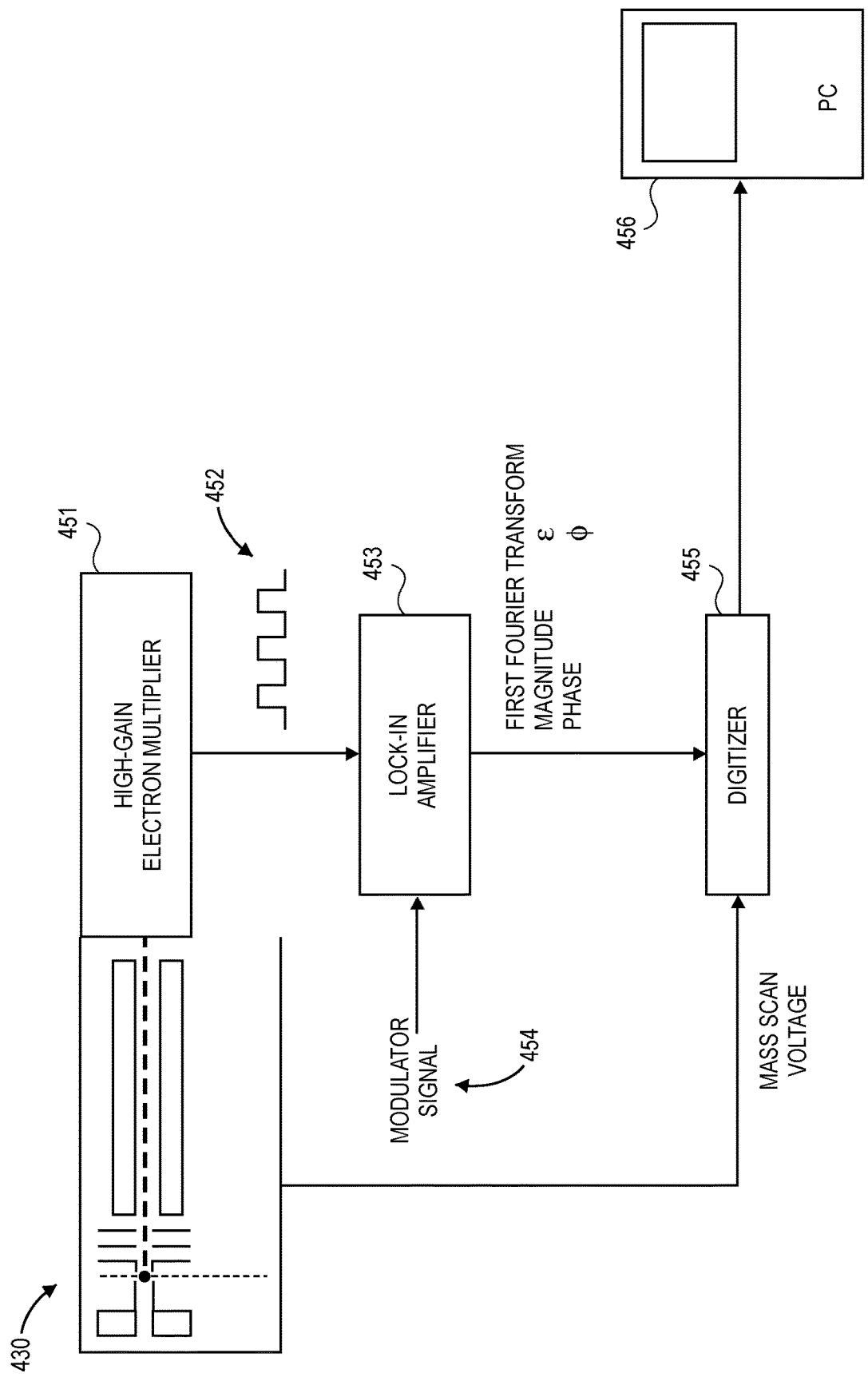
FIG. 4 is a diagram of a process for measuring radical concentrations with low background noise, in accordance with an embodiment.

Referring now to FIG. 4, a process flow of a method for processing a signal obtained by the NRMS analyzer 120 is shown, in accordance with an embodiment. As shown, a signal 452 is generated by a high-gain electron multiplier 451 at the end of the second chamber 430 (e.g., the RGA or mass spectrometer). As shown, the signal 452 is a modulated signal (e.g., square wave). Since the modulation frequency of the modulator 127 is known, a modulator signal 454 can be fed to a lock-in amplifier 453. The lock-in amplifier essentially filters out all of the signals that are not at the modulation frequency, leaving behind a high signal-to-noise ratio signal. A fast Fourier transform (FFT) then provides a magnitude and phase that can be fed to a digitizer 455. The resulting signal is then provided to a computer 456. The computer 456 may be used as a controller in order to provide closed loop control of a processing operation in a processing chamber. In one embodiment the square-wave signal from the RGA and control signal from the modulator may be digitized first and then the digital information may be processed to numerically obtain the FFT values for magnitude and phase thus replacing the hardware of the lock-in detector with the software employing the Fourier Transform algorithm.

It is to be appreciated that closed loop control refers to the use of quantitative measurements as a feedback signal to a controller in order to modify processing conditions in an ongoing process. For example, in the case of the measurement of radical species, a concentration of the radical species can be measured, and the measured value can be compared to a setpoint value. When the measured value is below the setpoint value, processing parameters may be changed to increase the generation rate and output concentration of radical species, or when the measured value is above the setpoint value, processing parameters may be changed to decrease the concentration of radical species. As such, more stable and reproducible processes can be implemented.

Figure 5:
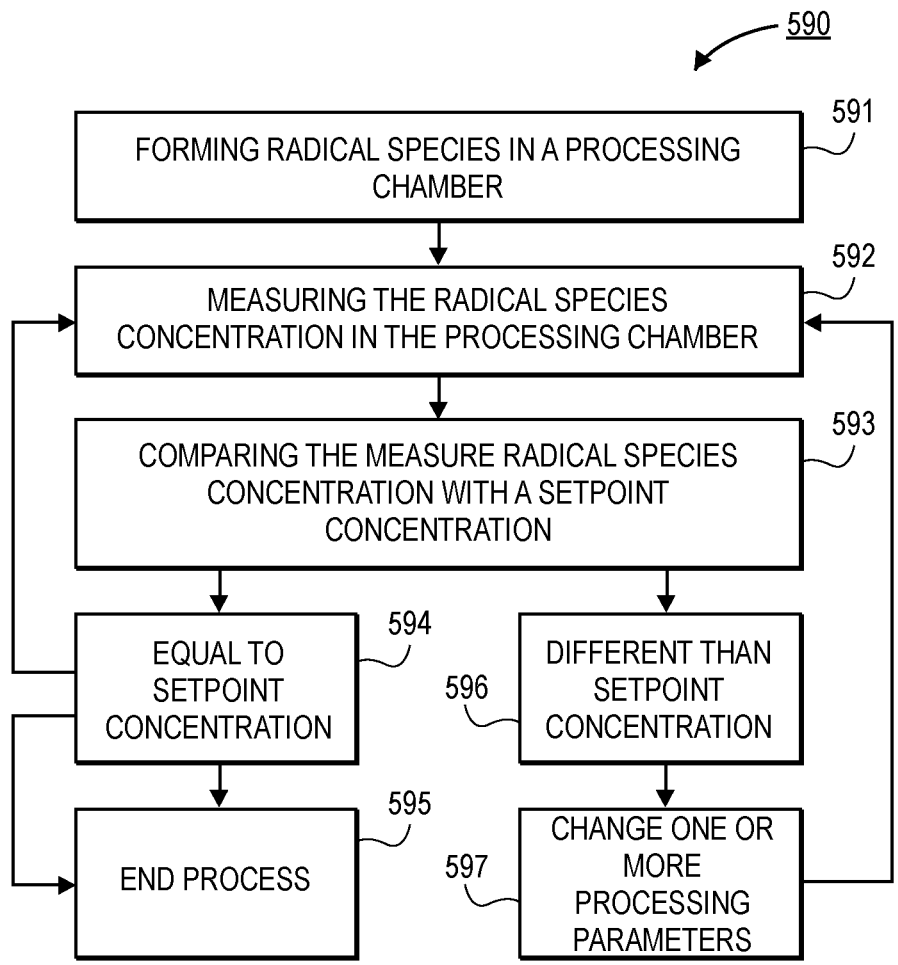
FIG. 5 is a process flow diagram of processing a substrate in a processing chamber using closed loop control, in accordance with an embodiment.

Referring now to FIG. 5, a process flow diagram illustrating a process 590 for processing a substrate in a processing chamber using closed loop control is shown, in accordance with an embodiment. In an embodiment, the processing chamber may be used for any process that utilizes radical species. In some embodiments, the process 590 is an etching operation, a deposition operation, a chamber cleaning operation, a plasma treatment operation, or any other type of operation typical of a semiconductor manufacturing facility. In a particular embodiment, the process 590 is a process that utilizes radical species in order to implement the process. For example, radical fluorine may be used in an etching or a chamber cleaning process.

In an embodiment, process 590 may begin with operation 591 which comprises forming radical species in a processing chamber. In an embodiment, the radical species may be formed with a plasma process. A controller may be used to control the plasma source, the flow rate of source gasses, pressures, and the like in order to provide a desired radical species concentration. In a particular embodiment, the radical species is atomic fluorine.

In an embodiment, process 590 may continue with operation 592 which comprises measuring the radical species concentration in the processing chamber. In an embodiment, the radical species concentration may be detected by an NRMS analyzer. For example, the NRMS analyzer may be fluidically coupled to the processing chamber. The NRMS analyzer may be substantially similar to the NRMS analyzer 120 described in greater detail above. For example, the NRMS analyzer may comprise a first chamber for modulation and a second chamber for mass spectrometry (e.g., a quadrupole mass spectrometer). The NRMS analyzer may be coupled to the processing chamber by an isolation gate valve. When operation 591 is implemented, the isolation gate valve is opened. A molecular beam is then able to propagate from the processing chamber to the second chamber in an unobstructed manner. The NRMS analyzer may provide a measure of the radical species concentration to the controller. For example, a process similar to the process shown in FIG. 4 may be used in some embodiments.

In an embodiment, process 590 may continue with operation 593, which comprises comparing the measured radical species concentration with a setpoint concentration. When the measured radical species concentration is substantially equal to the setpoint concentration, then the control parameters are maintained and the processing continues, as indicated by branch 594. Branch 594 may continue by cycling back to operation 592 to make additional measurements or the process may be ended, as indicated by branch 595. When the measured radical species concentration is substantially above or below a setpoint concentration branch 596 is taken. On branch 596, the controller may adjust one or more of the processing parameters in order to bring the radical species concentration back towards the setpoint concentration, as indicated by box 597. The process may then continue by cycling back to operation 592 where additional measurements of the radical species concentration are made and compared to the setpoint at operation 593.

In some embodiments, the process 590 may be utilized as part of a machine learning (ML) and/or artificial intelligence (AI) algorithms used in the control of processing of one or more substrates in a processing tool and/or control of processing of substrates in multiple different processing chambers. For example, the controller may use ML or AI processes in order to return radical species concentrations back to the setpoint. Additionally, data collected by the process 590 may be stored for use as learning or training data for ML or AI algorithms.

Figure 6:
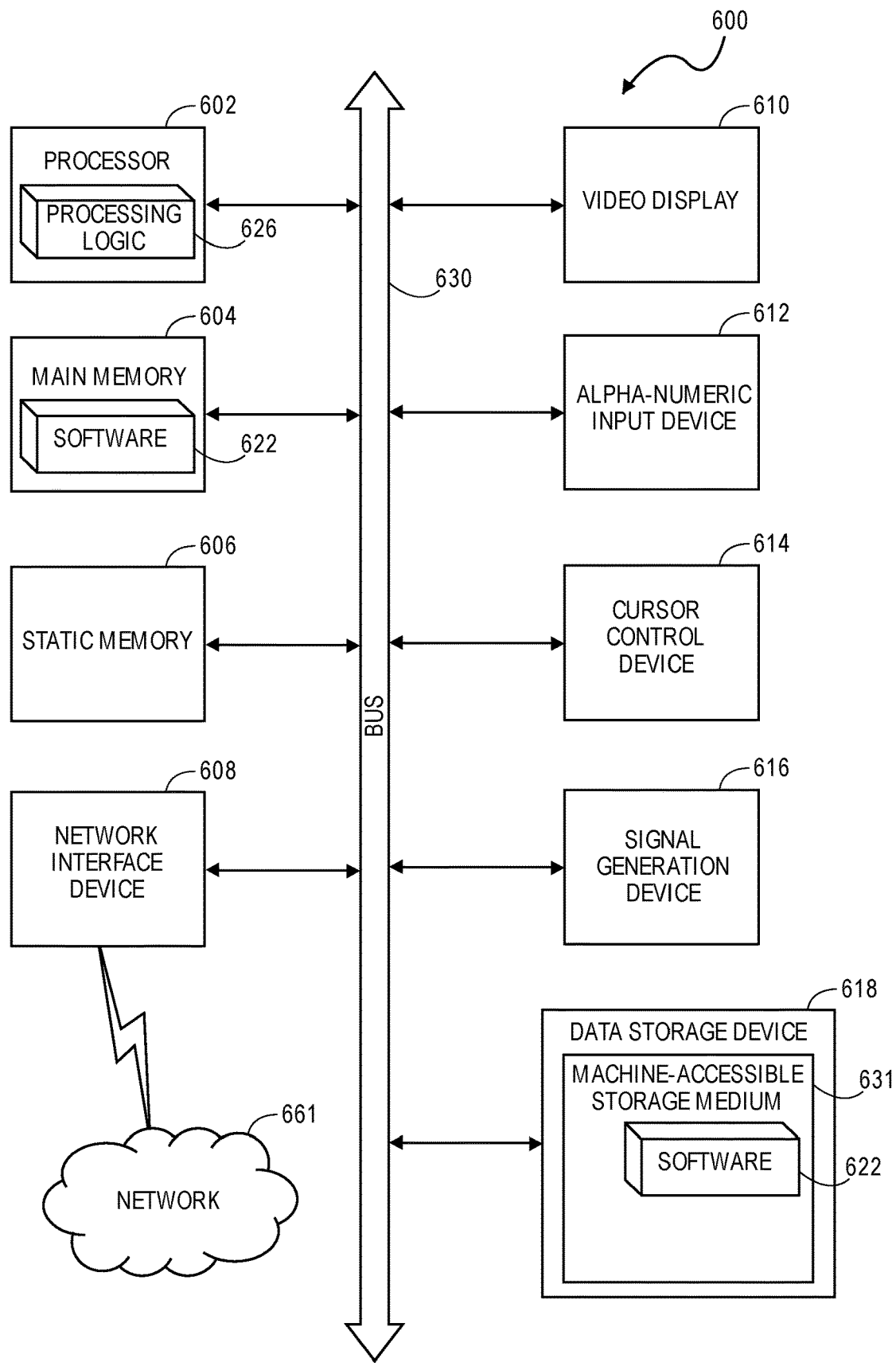
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), MRAM, etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 526 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 514 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 520 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of closed loop control of a radical concentration in a processing operation using an NRMS analyzer.

Thus, methods for measuring gas concentration have been disclosed.

What is claimed is:

1. A processing tool, comprising:
   a processing chamber; and
   a neutral radical mass spectrometry (NRMS) analyzer fluidically coupled to the processing chamber, wherein the NRMS analyzer comprises:
   a first chamber fluidically coupled to the processing chamber, wherein the first chamber comprises a modulator, the modulator configured to chop a molecular beam from the processing chamber to generate a square wave signal; and
   a second chamber fluidically coupled to the first chamber, wherein the second chamber is a residual gas analyzer or a mass spectrometer, and wherein an unobstructed line of sight passes from the processing chamber to the second chamber.

2. The processing tool of claim 1, wherein the first chamber is configured to be at a first pressure that is lower than a pressure of the processing chamber, and wherein the second chamber is configured to be at a second pressure that is lower than the first pressure.

3. The processing tool of claim 2, wherein differential pumping is used to provide the first pressure and the second pressure.

4. The processing tool of claim 2, wherein the first pressure is between approximately 1 mTorr and approximately 100 mTorr, and wherein the second pressure is between approximately 0.1 µTorr and approximately 100 µTorr.

5. The processing tool of claim 1, further comprising:
   a valve between the processing chamber and the first chamber.

6. The processing tool of claim 5, wherein the valve is an isolation gate valve.

7. The processing tool of claim 1, wherein the modulator is a disk that comprises one or more openings, and wherein the disk is configured to be rotated to provide a desired modulation frequency.

8. The processing tool of claim 7, wherein the modulation frequency is between approximately 10 Hz and approximately 1000 Hz.

9. The processing tool of claim 1, wherein the second chamber is a quadrupole mass spectrometer.

10. The processing tool of claim 9, wherein the quadrupole mass spectrometer is configured to provide cross-beam ionization.

11. The processing tool of claim 1, wherein the second chamber further comprises a sensor.

12. The processing tool of claim 11, wherein the sensor is an electron multiplier or a Faraday cup.

13. A method of processing a substrate, comprising:
   initiating a plasma in a processing chamber that comprises a substrate;
   measuring a concentration of radical species in the plasma with a neutral radical mass spectrometry (NRMS) analyzer that is fluidically coupled to the processing chamber, wherein the NRMS analyzer comprise a modulator in order to modulate the signal sensed by a sensor of the NRMS analyzer, the modulator configured to chop a molecular beam from the processing chamber to generate a square wave signal;
   comparing a measured concentration of the radical species in the plasma with a setpoint concentration of the radical species; and
   adjusting one or more plasma parameters with a controller in order to return the measured concentration of the radical species to the setpoint concentration of the radical species.

14. The method of claim 13, wherein the modulated signal sensed by the sensors is provided to a lock-in amplifier in order to reduce noise.

15. The method of claim 13, wherein the NRMS analyzer comprises a quadrupole mass spectrometer.

16. The method of claim 15, wherein the quadrupole mass spectrometer is configured to use cross-beam ionization.

17. The method of claim 13, wherein adjusting one or more plasma parameters is implemented using.

18. A plasma processing tool, comprising:
   a processing chamber; and
   a neutral radical mass spectrometry (NRMS) analyzer fluidically coupled to the processing chamber, wherein the NRMS analyzer comprises:
   a first chamber fluidically coupled to the processing chamber by an isolation gate valve, wherein the first chamber comprises a modulator, the modulator configured to chop a molecular beam from the processing chamber to generate a square wave signal, and wherein a first pump is fluidically coupled to the first chamber; and
   a second chamber fluidically coupled to the first chamber, wherein the second chamber is a residual gas analyzer or a mass spectrometer, wherein a second pump is fluidically coupled to the second chamber, and wherein an unobstructed line of sight passes from the processing chamber to the second chamber.

19. The plasma processing tool of claim 18, wherein the NRMS analyzer is configured to provide closed loop control of a radical species concentration in the processing chamber.

* * * * *